(12) United States Patent
Rasouli et al.

(10) Patent No.: US 9,755,618 B1
(45) Date of Patent: Sep. 5, 2017

(54) LOW-AREA LOW CLOCK-POWER FLIP-FLOP

(71) Applicant: QUALCOMM Incorporated, San Diego, CA (US)

(72) Inventors: Seid Hadi Rasouli, San Diego, CA (US); Xiangdong Chen, San Diego, CA (US); Venugopal Boynapalli, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 48 days.

(21) Appl. No.: 15/061,055

(22) Filed: Mar. 4, 2016

(51) Int. Cl.
    *H03K 3/12*     (2006.01)
    *H03K 3/012*     (2006.01)
    *H03K 3/356*     (2006.01)

(52) U.S. Cl.
    CPC ....... *H03K 3/012* (2013.01); *H03K 3/356104* (2013.01)

(58) Field of Classification Search
    CPC .................. H03K 5/012; H03K 3/356104
    USPC .................................. 327/199–217
    See application file for complete search history.

(56) References Cited

U.S. PATENT DOCUMENTS

| | | | |
|---|---|---|---|
| 6,204,695 B1 | 3/2001 | Alfke et al. | |
| 6,472,909 B1 | 10/2002 | Young | |
| 6,624,677 B1 * | 9/2003 | Wissel | H03K 3/0372 327/202 |
| 7,265,599 B1 | 9/2007 | Pasqualini | |
| 7,902,878 B2 | 3/2011 | Saint-Laurent et al. | |
| 7,940,100 B2 * | 5/2011 | Keskin | H03K 3/037 327/161 |
| 8,072,252 B2 | 12/2011 | Bailey | |
| 8,957,718 B2 | 2/2015 | Maeno | |
| 9,035,686 B1 | 5/2015 | Hsu et al. | |
| 9,130,549 B2 | 9/2015 | Balasubramanian et al. | |
| 9,270,270 B2 | 2/2016 | Cai et al. | |
| 2015/0116019 A1 | 4/2015 | Hsu et al. | |
| 2016/0043706 A1 | 2/2016 | Elkin et al. | |

FOREIGN PATENT DOCUMENTS

WO      2014179944 A1      11/2014

OTHER PUBLICATIONS

International Search Report and Written Opinion—PCT/US2017/017459—ISA/EPO —May 10, 2017.

* cited by examiner

*Primary Examiner* — Dinh T Le
(74) *Attorney, Agent, or Firm* — Arent Fox, LLP and Qualcomm, Incorporated

(57) ABSTRACT

In one example, the apparatus includes a first AND gate, a second AND gate, a first NOR gate, a second NOR gate, a third NOR gate, a first inverter, and a second inverter. The first AND gate output is coupled to the first NOR gate first input. The first NOR gate output is coupled to the second NOR gate first input. The second NOR gate output is coupled to the first NOR gate second input. The first inverter output is coupled to the first AND gate second input and the second NOR gate second input. The second AND gate first input is coupled to the first inverter output. The third NOR gate first input is coupled to the second NOR gate output. The third NOR gate second input is coupled to the second AND gate output. The second inverter output is coupled to the second AND gate second input.

19 Claims, 5 Drawing Sheets

LOW-AREA LOW CLOCK-POWER FLIP-FLOP

BACKGROUND

Field

The present disclosure relates generally to flip-flop circuitry, and more particularly, to a flip-flop design that may have a decreased number of transistors with clock connections.

Background

In many circuit designs, devices in the design may use the most power when a state of a signal through the device changes. For example, a transistor logic circuit may use the most power when it changes states from a first logic state to a second logic state. The device may use almost no power or very low power when the device maintains a particular state, e.g., a logic high or a logic low. Complementary metal-oxide-semiconductor (CMOS) devices, for example, generally have low static power consumption because one transistor of a pair of series combination transistors in a CMOS device is generally off most of the time. The series combination of transistors draws significant power only momentarily during switching between states, e.g., from logic high to logic low or from logic low to logic high. Consequently, CMOS devices generally do not use as much power or produce as much heat as other forms of logic devices (assuming other factors are generally equal, such as the clock speed used, the logic functions implemented, the inputs switching, the outputs switching, the internal signals switching, or any other factors that may impact power consumption or heat produced).

Many circuit designs may be clocked by a clock source. The clock source may be the most common switching signal in the circuit design. The number of circuits, e.g., CMOS transistor pairs that are driven by the clock source will generally impact the power used by the circuit design. It may generally be preferable to decrease the power used by a circuit design. Decreasing the power used by a circuit design may increase battery life in a battery powered system, allow for greater functionality for the same battery life in a battery powered system, decrease heat generation, decrease the need for cooling of the circuit design, allow for increased circuit density due to decreased heat generation, to name only a few benefits.

SUMMARY

The following presents a simplified summary of one or more aspects in order to provide a basic understanding of such aspects. This summary is not an extensive overview of all contemplated aspects and is intended to neither identify key or critical elements of all aspects nor delineate the scope of any or all aspects. Its sole purpose is to present some concepts of one or more aspects in a simplified form as a prelude to the more detailed description that is presented later.

As described above, in many circuit designs, devices in the design may use the most power when a state of a signal through the device changes. The device may use almost no power or very low power when the device maintains a particular state, e.g., a logic high or a logic low. Many designs may be clocked by a clock source. The clock source may be the most common switching signal in the circuit design. Accordingly, minimizing the devices, e.g., transistors, that are connected to the clock source may decrease power usage by the circuit. Some previous flip-flop designs may use 12 transistors connected to a clock (and additional transistors that are not connected to the clock). Decreasing the number of transistors connected to the clock may generally decrease power used by the flip-flop design.

In an aspect of the disclosure, a method and an apparatus are provided. The apparatus may include a first AND gate. The first AND gate may include a first AND gate first input, a first AND gate second input, and a first AND gate output. The first AND gate first input may be a delay (d) input of the flip-flop. (The delay input may also be referred to as a data input.) The apparatus may include a first NOR gate. The first NOR gate may include a first NOR gate first input, a first NOR gate second input, and a first NOR gate output. The first AND gate output may be coupled to the first NOR gate first input. The apparatus may include a second NOR gate. The second NOR gate may include a second NOR gate first input, a second NOR gate second input, and a second NOR gate output. The first NOR gate output may be coupled to the second NOR gate first input. The second NOR gate output may be coupled to the first NOR gate second input. The apparatus may include a first inverter. The first inverter may include a first inverter input and a first inverter output. A clock signal may be coupled to the first inverter input. An inverted clock signal may be output from the first inverter output. The first inverter output may be coupled to the first AND gate second input and the second NOR gate second input. The apparatus may include a second AND gate. The second AND gate may include a second AND gate first input, a second AND gate second input, and a second AND gate output. The second AND gate first input may be coupled to the first inverter output. The apparatus may include a third NOR gate. The third NOR gate may include a third NOR gate first input, a third NOR gate second input, and a third NOR gate output. The third NOR gate first input may be coupled to the second NOR gate output. The third NOR gate second input may be coupled to the second AND gate output. The apparatus may include a second inverter. The second inverter may include a second inverter input and a second inverter output. The second inverter output may be coupled to the second AND gate second input.

The flip-flop structure described above may, in some examples, decrease the number of transistors connected to the clock. Decreasing the number of transistors connected to the clock may generally decrease power used by the flip-flop design in some cases.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

An example flip-flop design may use an AND-OR-Inverter (AOI) structure. More particularly, the example flip-flop design in FIG. 1 may use two AOI structures and a NOR gate (along with various other circuit components including inverters.) The OR and Inverter of the AOI structure may be implemented by a NOR gate because a NOR gate is a combination of an OR gate and an inverter.

Figures 1A, 1B:
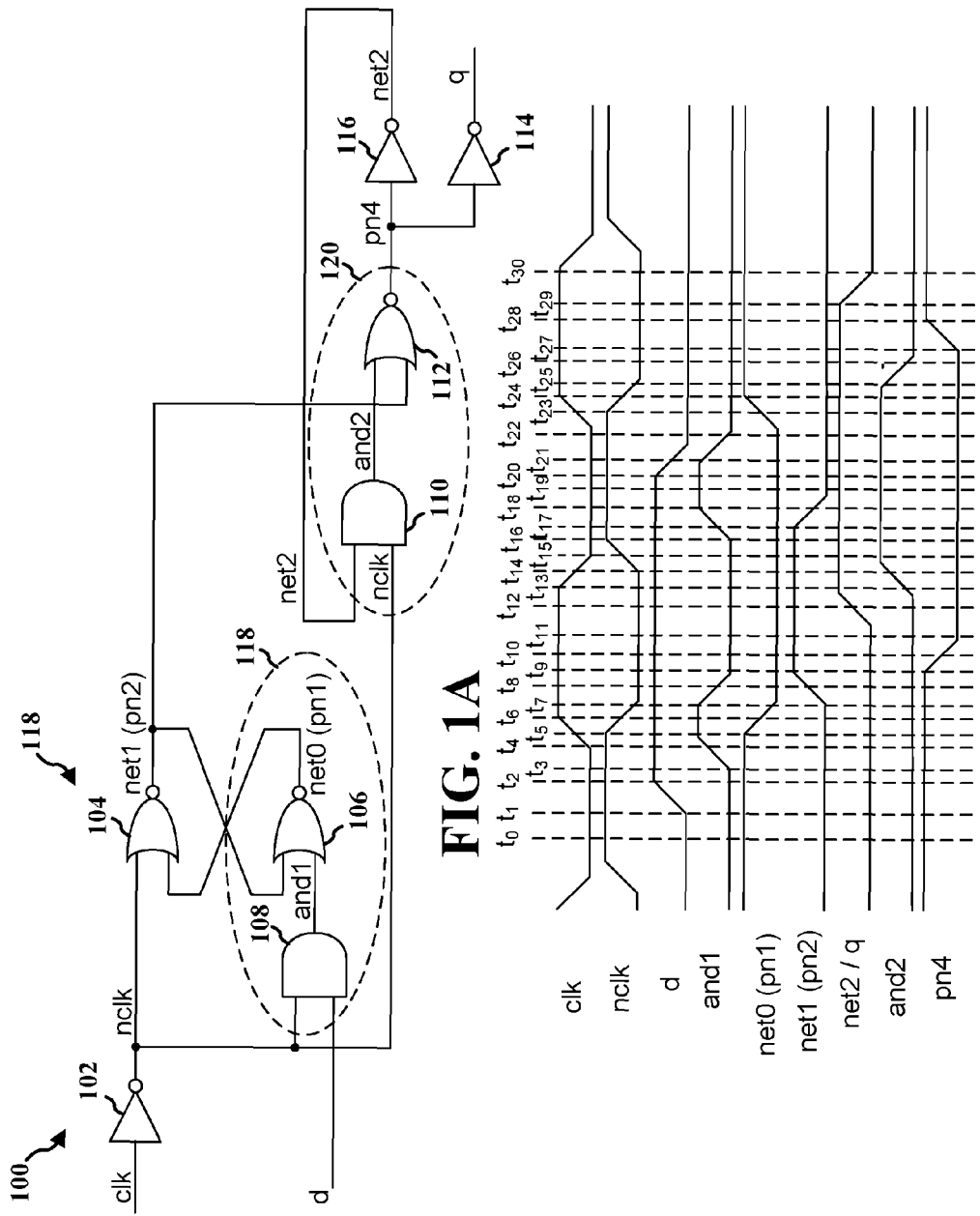
FIG. 1A is a logic diagram illustrating an example flip-flop in accordance with the systems and methods described herein.
FIG. 1B is a timing diagram illustrating signal timing for various signals related to the circuit diagram of the flip-flop in FIG. 1A.

FIG. 1A is a logic diagram illustrating an example flip-flop 100 in accordance with the systems and methods described herein. The flip-flop 100 includes an inverter 102, cross-coupled NOR gates 104, 106, an AND gate 108, an AND gate 110, a NOR gate 112, and inverters 114, 116. The flip-flop 100 includes two AND-OR-Inverter (AOI) circuit structures 118, 120. The first AOI circuit structure 118 includes an AND gate 108 and a NOR gate 106. The NOR gate 106 provides the OR functionality and the inverter functionality of the first AOI circuit structure 118. Similarly, the second AOI circuit structure 120 includes AND gate 110 and NOR gate 112. The NOR gate 112 provides the OR functionality and the inverter functionality of the second AOI circuit structure 120.

FIG. 1B is a timing diagram illustrating signal timing for various signals related to the circuit diagram of the flip-flop 100 in FIG. 1A. The signals illustrated in FIG. 1B include inputs to the flip-flop 100 such as the clock signal (clk) and the "d" input to the flip-flop 100. The signals illustrated in FIG. 1B also include the "q" output from the flip-flop. Additionally, the signals illustrated in FIG. 1B include signals internal to the flip-flop 100 such as the inverted clock (nclk), net0, net1, net2, net3, net4, and pn4.

The flip-flop 100 of FIG. 1A may have an initial state at time $t_0$, where the clock signal is low (clk=0), the inverted clock is high (nclk=1), and the d input to the flip-flop 100 is low (d=0). In the initial state at time $t_0$, the and1 signal is low because the d input to the flip-flop 100 is low (nclk is high). In the illustrated example of FIG. 1B, it is assumed that the net0 signal is 1 at time $t_0$. Accordingly, assuming the net0 signal is 1 at time $t_0$, the net1 signal is 0 at time $t_0$. At time $t_0$, the net2 signal is low, the and2 signal is low, and pn4 is high.

At time $t_1$, the d input to the flip-flop 100 begins to rise in the example illustrated in FIG. 1B. At time $t_2$, the d input is high. Accordingly, the nclk signal and the d input will both be logic high values at the time $t_2$. Thus, the AND gate 108 will have logical high values on each of the AND gate 108 inputs. After some small delay, at time $t_3$, the output of the AND gate 108, referred to as the and1 signal in the timing diagram, will begin to rise.

At time $t_4$, the clock signal begins to rise. Depending on how long and1 takes to change states, it may be continuing to rise, as illustrated in FIG. 1B. At time $t_5$, the and1 signal is high based on the inputs to the AND gate 108 because the nclk signal and the d input are both high. The net0 signal begins to fall based on the change to and1 from low to high. Incidentally, at time $t_5$, the nclk signal also begins to fall. Note that in this instance, the rising edge of the and1 signal and the falling edge of the nclk signal before time is are not linked even though the and1 signal is a logical AND function of the nclk signal and the d input. Rather, in this instance, the rising edge of the and1 signal is controlled by the rising edge of d because the nclk signal is already high at time $t_3$.

At time $t_6$, the clk signal is high and the nclk signal is falling. Additionally, the flip-flop 100 will have begun to clock in the high logical value on the d input. At time $t_6$, net0 continues to fall based on the change of and1 to high. At time t7, net0 is 0. The and1 signal begins to fall based on the nclk signal being low. The net' signal will begin to rise because nclk and net0 are both low.

It will be understood that in the illustrated example of FIG. 1A, the net2 signal and the q input are generated by two separate inverter 114, 116. Accordingly, the exact timing of the net2 signal and the q output may vary. For the purposes of the timing diagram of FIG. 1B, however, the net2 signal and the q signal are illustrated as the same signal.

At time $t_8$, the and1 signal continues to fall, and the net1 signal continues to rise. These changes, i.e., the and1 signal beginning to fall and the net1 signal beginning to rise, are both based on the falling edge of the nclk signal at time $t_5$. At time $t_9$, the pn4 signal begin to fall. At time $t_{10}$, the pn4 signal continues to fall. At time $t_{11}$ the pn4 signal is low. After a delay, at time $t_{11}$, the net2 signal begins to rise because the pn4 signal was low at time $t_{10}$. At time $t_{12}$ the net2 signal is high. At time $t_{13}$ the clk signal begins to fall. After a delay, at time $t_{14}$, the nclk signal begins to rise. At time $t_{15}$, the clk signal is low. The nclk signal continues to rise.

At time $t_{16}$, the and1 signal begins to rise because the d input is high and the nclk signal is high. Additionally, at time $t_{16}$, the nclk signal is high. Accordingly, after a slight delay through the NOR gate 104, at time $t_{17}$, net1 begins to fall. At time $t_{17}$, the and1 signal begins to rise because the nclk signal is high and the d input is high. The net1 signal begins to fall because the nclk signal is now high. Additionally, the and2 signal begins to rise because the net2 signal is high and the nclk signal is high. The and1 signal is high at time $t_{18}$. The and2 signal is high and net1 is low at $t_{19}$. At time $t_{20}$, the d input begins to fall. At time $t_{21}$ the and1 signal begins to fall because the d input had a falling edge at time $t_{19}$.

At time $t_{22}$ the d input is low and the and1 signal is low based on the d input being low. The net0 signal begins to rise after a small delay based on the and1 signal being low. Additionally, just after time $t_{22}$, the clk signal begins to rise. At time $t_{23}$, the clk signal continues to rise, the nclk signal begins to fall, and net0 continues to rise. At time $t_{24}$ the clk signal is high, and nclk continues to fall. At time $t_{25}$, the and2 signal begins to fall based because nclk is low. At time $t_{26}$, the and2 signal is low. At time $t_{27}$ the pn4 signal begins to rise. At time $t_{28}$ pn4 is high. At time $t_{29}$ the net2 signal begins to fall. At time $t_{30}$ the net2 signal is low.

As illustrated in FIG. 1B, the flip-flop 100 of FIG. 1A implements a d-type flip-flop or "d flip-flop." The d flip-flop is also known as a "data flip-flop" or as a "delay flip-flop."

The d flip-flop captures the value of the d-input at the rising edge of a clock, e.g., the rising edge of the clk signal. The value captured at the rising edge of the clk signal becomes the q output. Generally, the q output does not change independently of the clk signal.

An example truth table for the d flip-flop is:

| Clock | D | Qnext |
|---|---|---|
| Rising edge | 0 | 0 |
| Rising edge | 1 | 1 |
| Non-Rising | X | Q |

Figure 2:
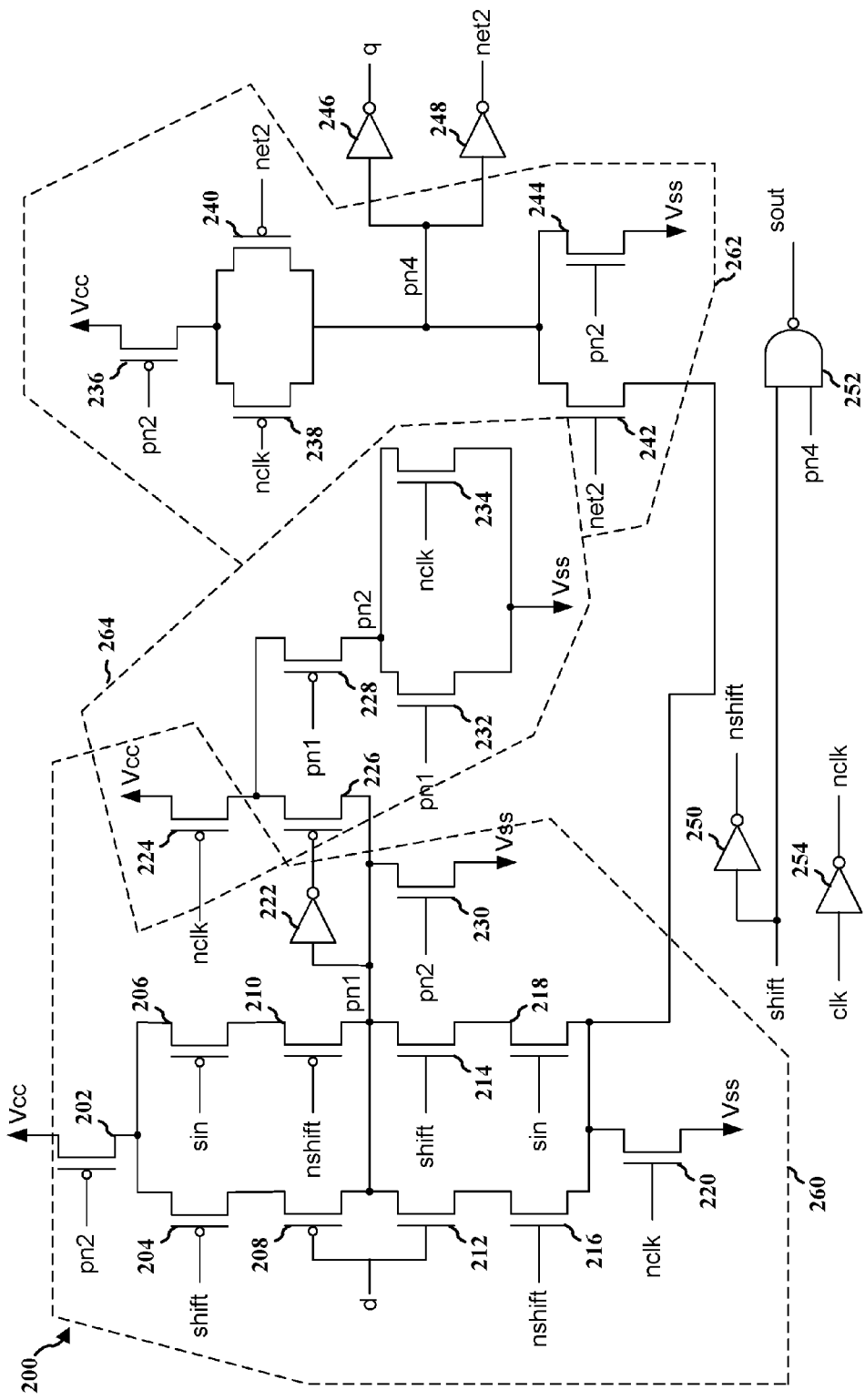
FIG. 2 is a circuit diagram illustrating an example flip-flop in accordance with the systems and methods described herein.

FIG. 2 is a circuit diagram illustrating an example flip-flop 200 in accordance with the systems and methods described herein. The flip-flop 200 is an example of an AOI based flip-flop design using a similar gate structure to the flip-flop 100 of FIG. 1. The flip-flop 200 is illustrated at the transistor level. Additionally, the flip-flop 200 includes two AOI circuit structures 260, 262. The dotted-line shapes used to highlight the AOI circuit structures 260, 262 are intended to provide the general location of each AOI circuit structure 260, 262. In some cases, circuit elements, e.g., transistors, may be shared between the AOI circuit structures 260, 262 and/or one of the AOI circuit structures 260, 262 and a NOR gate structure 264. For example, p-Channel Metal Oxide Semiconductor (PMOS) transistor 224 is shared with AOI circuit structure 260 and the NOR gate structure 264. Similarly, the NMOS transistor 220 is shared between the AOI circuit structure 260 and the AOI circuit structure 262.

The flip-flop 200 includes a scan input (sin) for a scan mode and a data input for a functional mode. When the shift signal is low (and the nshift signal is high) the data input is enabled and the scan input is disabled. Conversely, when the shift signal is high (and the nshift signal is low) scan input is enabled and the data input is disabled. The scan mode may be used for testing the circuitry of flip-flop 200. During scan mode the inverse of the pn4 signal may be output through NAND gate 252 on the scan out (sout) signal line. Sout is disabled (held low) during a functional mode.

The first AOI circuit structure 260 includes transistors to form an AND gate/NOR gate structure. (The OR-Inverter portion of the AOI structure may be formed by a NOR gate.) The first AOI circuit structure 260 also includes various shift circuitry, which functions as a multiplexer for selecting between the data input or the scan input. Similarly, the second AOI circuit structure 262 also includes transistors to form an AND gate/NOR gate structure. The second AOI circuit structure 262 does not include any shift circuitry, and accordingly, has fewer transistors when compared to the first AOI circuit structure 260. The flip-flop 200 also includes the NOR gate structure 264. The circuitry illustrated in FIG. 2 may be used to implement the logical elements illustrated in FIG. 1A, which include two AOI circuit structures 118, 120 and a NOR gate 104 (as well as various inverters 102, 116, 114).

As illustrated in FIG. 2, the first AOI circuit structure 260 includes PMOS transistors 202, 204, 206, 208, 210, 224, 226 and NMOS transistors 212, 214, 216, 218, 220, 230. The second AOI circuit structure 262 includes PMOS transistors 236, 238, 240 and NMOS transistors 220, 242, 244. The NOR gate structure 264 includes PMOS transistors 224, 228, and NMOS transistors 232, 234. Additional circuitry in flip-flop 200 includes the inverters 222, 250, 254, and the NAND gate 252.

The AND-OR-Inverter function may be combined so that the first AOI circuit structure 260 does not include each transistor that would be required for an individual AND gate, an individual OR gate, and an individual inverter. For example, instead of connecting an output of a group of transistors forming an AND gate (e.g., AND gate 108 of FIG. 1) to an input of a group of transistors forming a NOR gate (e.g., NOR gate 106 of FIG. 1), the group of transistors for the AND gate may be connected in place of a transistor input for the NOR gate. As a more specific example, PMOS transistor 202 and n-Channel Metal Oxide Semiconductor (NMOS) transistor 230 form one input of a NOR gate. As described above, the AOI circuit 260 includes PMOS transistors 202, 204, 206, 208, 210 and NMOS transistors 212, 214, 216, 218, 220, 230. The PMOS transistors 208, 224, 202 and the NMOS transistors 212, 220, 230 function as the AND gate 108 and the NOR gate 106.

The first AOI circuit structure 260 includes the function of the AND gate 108, generally formed by the PMOS transistors 208, 224 and the NMOS transistors 212, 220. Additionally, the first AOI circuit structure 260 includes the function of the NOR gate 106. The NOR gate 106 may provide the OR functionality and the inverter functionality. The NOR gate 106 is generally formed by the PMOS transistors 202, 208, 224, and the NMOS transistors 212, 220, 230. The PMOS transistor 202 and the NMOS transistor 230 provide the pn2 signal input to the NOR gate 106. The PMOS transistors 208, 224, and the NMOS transistors 212, 220, which generate the AND function, provide the other input to the NOR gate. (The PMOS transistors 204, 206, 210 and the NMOS transistors 214, 216, 218 provide for the scan-input and multiplexer functionality as discussed above.)

Assuming the shift input is low, the flip-flop 200 functions as a d flip-flop with the d input signal as the input to the flip-flop 200. When the shift signal is low and the nshift signal is high, the PMOS transistor 210 and the NMOS transistor 214 are both off, and no current may flow through the PMOS transistors 206, 210 and the NMOS transistors 214, 218. The PMOS transistor 204 and the NMOS transistor 216 are both on, and current may flow through the PMOS transistors 202, 204, 208 and the NMOS transistors 212, 216, 220, depending on the inputs to the PMOS transistors 202, 208 and the NMOS transistors 220, 212, i.e., the pn2 signal and the d input, respectively. Accordingly, when the shift input is low, the pn1 signal is a function of the d input to the flip-flop, the pn2 signal, and the nclk signal along with some feedback of the pn1 signal (as is also illustrated in the logic diagram illustrated in FIG. 1A).

When the pn1 signal is high, pn1 will continue to be high whenever the nclk signal is low because the PMOS transistors 224, 226 are both on. The PMOS transistor 226 is on because the high pn1 signal is inverted by the inverter 222 coupled to the the PMOS transistor 226. The PMOS transistor 224 is on because the nclk signal is low.

When the pn2 signal is low, the pn1 signal will be high when the d input is low. The pn1 signal will be high because the PMOS transistors 202, 204, 208 are on when the pn2 signal, the shift signal, and the d input are all low. The NMOS transistor 212 is off because the d input is low. (The PMOS transistor 210 and the NMOS transistor 214 are assumed to be off.) When the pn2 signal is low, the pn1 signal will be low when the d input is high, and the nclk signal is high because the PMOS transistors 202, 204, 208 are off with the pn2 signal high, the shift signal high, and the d input high, respectively. The NMOS transistors 212, 216, 220 are on because the d input is high, the nshift signal is high, and the nclk signal is high, respectively. When the pn2 signal is high, the pn1 signal will be low because the PMOS transistor 202 is off with the signal pn2 high and the NMOS transistor 230 is on with the pn2 signal high.

As illustrated in FIG. 2, when the shift signal is high, the shift functionality is active and logical values may be shifted in to the flip-flop using the shift-in (sin) signal. With the shift signal high, the PMOS transistor 204 and the NMOS transistor 216 are off, while the PMOS transistor 210 and the NMOS transistor 214 are on. Accordingly, pn1 is a function of sin, pn2, and nclk. When the pn2 signal is low, the pn1 signal will be high when the sin signal is low because the PMOS transistors 202, 206, 210 are on with the pn2 signal, the sin signal, and the nshift signal low and the NMOS transistor 218 is off because the sin signal is low.

When the pn2 signal is low, the pn1 signal will be low when the sin signal and the nclk signal are high because the PMOS transistors 202, 206, 210 are off with the pn2 signal high, the sin signal high, and the nshift signal high and the NMOS transistors 214, 218, 220 are on because the shift signal, the sin signal, and the nclk signal are all high. When the pn2 signal is high, the pn1 signal will be low because the PMOS transistor 202 is off and the NMOS transistor 230 is on.

The second AOI circuit structure 262 includes PMOS transistors 236, 238, 240 and NMOS transistors 242, 244. The second AOI circuit structure 262 includes an AND gate generally formed by the PMOS transistor 238, 240 and the NMOS transistor 242. The AND gate in the second AOI circuit structure 262 also shares an NMOS transistor 220 with the first AOI circuit structure 260.

Additionally, the second AOI circuit structure 262 includes a NOR gate that may provide the OR functionality and the inverter functionality. The NOR gate is generally formed by the PMOS transistor 236 and the NMOS transistor 244 for the net1/pn2 signal input to the NOR gate and the PMOS transistors 238, 240 and the NMOS transistors 242 which generate the AND function tied to the other input to the NOR gate.

When the pn2 signal is low, the pn4 signal will be high when the nclk signal is low because the PMOS transistors 236, 238 will both be on. When the pn2 signal is low, the pn4 signal will also be high when net2 is low because the PMOS transistors 236, 240 will both be on. With the pn2 signal low, the NMOS transistor 244 will be off. With the net2 signal is low, the NMOS transistor 242 will be off. With the nclk signal is low, the NMOS transistor 220 will be off. Accordingly, pn4 will not be connected to Vcc and Vss at the same time. When the pn2 signal is high, the pn4 signal is low (Vss) because the NMOS transistor 244 is on. (The PMOS transistor 236 is off because pn2 is high.) The pn4 signal may also be pulled low through the NMOS transistors 242, 220, when both net2 and nclk are high. Accordingly, when the clk signal rises, a low value may be clocked into pn4 (corresponding to a high value at the q output and the net2 signal after a delay through the inverters 246, 248 respectively) when net2 starts out as a low value, allowing a high output to be clocked into q output of the flip-flop 200.

The NOR gate structure 264 includes PMOS transistors 224, 226, 228 and NMOS transistors 232, 234. The NOR gate structure 264 may be NOR gate 104 of FIG. 1. The NOR gate structure 264 is a two-input CMOS NOR gate including the PMOS transistors 224, 228 and the NMOS transistors 232, 234. A first input to the NOR gate structure is provided by PMOS transistor 228 and NMOS transistor 232, which are connected to the pn1 signal, as is one of the inputs of the NOR gate 104 of FIG. 1. A second input to the NOR gate structure is provided by PMOS transistor 224 and NMOS transistor 234, which are connected to the nclk signal, as is one of the inputs of the NOR gate 104 of FIG. 1.

Additional circuitry in flip-flop 200 includes inverters 222, 250, 254, and NAND gate 252. The inverter 222 provides an inverted version of pn1 to PMOS transistor 226 that allows the pn1 signal to be pulled high through PMOS transistors 224, 226 as described above. The inverter 250 is used to generate the nshift (not shift) signal used to control the shift features of the flip-flop 200. When the shift signal is high, the pn4 signal may be output on the shift out (sout) signal using NAND gate 252. Additionally, the inverter 254 is used to generate the inverted version of the clk signal, nclk.

Figure 3:
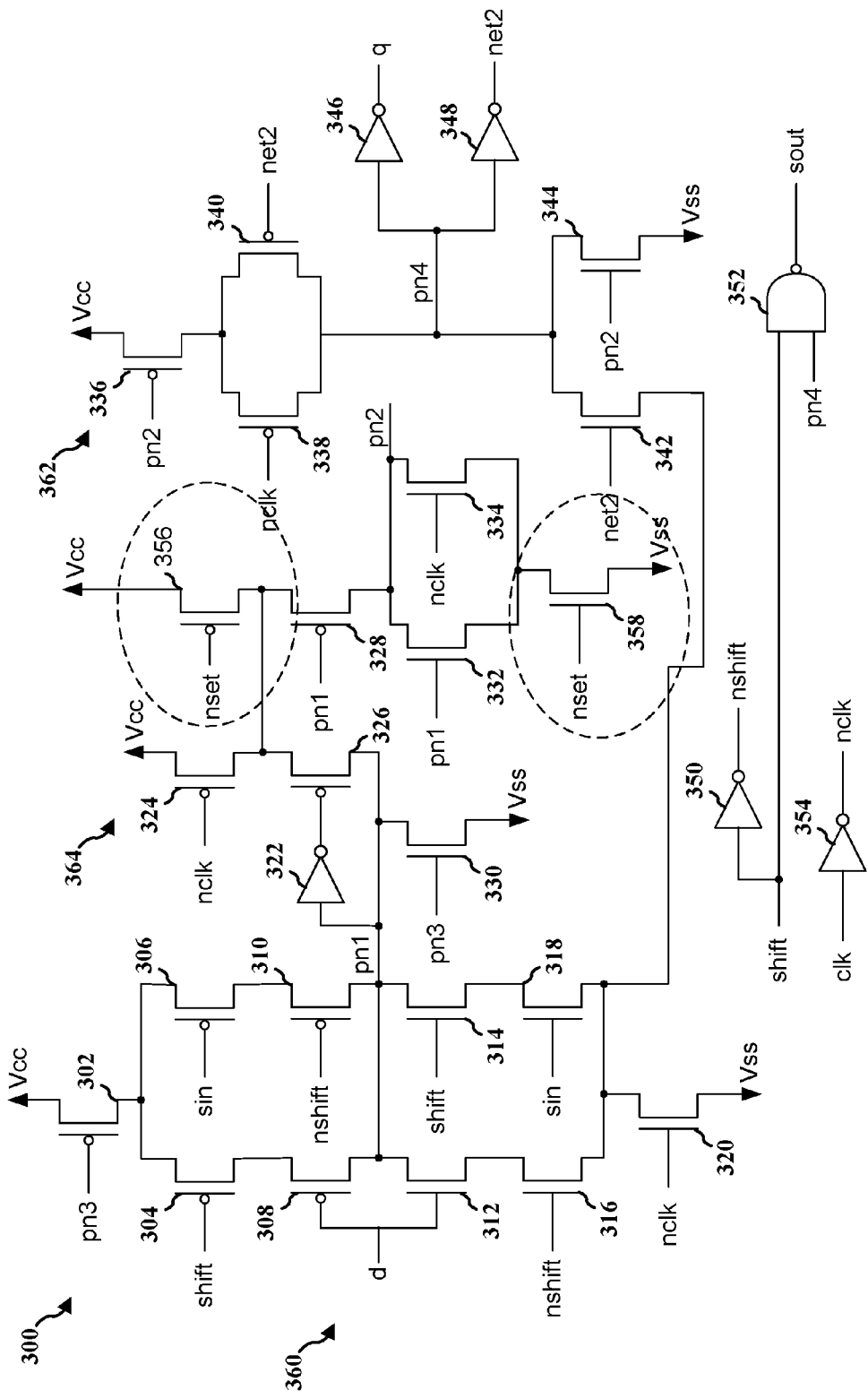
FIG. 3 is another circuit diagram illustrating an example flip-flop in accordance with the systems and methods described herein.

FIG. 3 is another circuit diagram illustrating an example flip-flop 300 in accordance with the systems and methods described herein. The flip-flop 300 is an example of an AOI based flip-flop design using a similar gate structure to the flip-flop 100 of FIG. 1. The flip-flop 300 is generally similar to the flip-flop 200 of FIG. 2 but includes circuitry providing an asynchronous set function. The flip-flop 300 includes two AOI circuit structures 360, 362, similar to the two AOI circuit structures 260, 262 of FIG. 2. The dotted-line shapes in FIG. 2 used to highlight the AOI circuit structures 260, 262 of FIG. 2 have been omitted from FIG. 3 to allow other features to be highlighted in FIG. 3.

The flip-flop 300 includes a scan input for a scan mode and a data input for a functional mode. When the shift signal is low (and the nshift signal is high) the data input is enabled and the scan input is disabled. Conversely, when the shift signal is high (and the nshift signal is low) scan input is enabled and the data input is disabled. The scan mode may be used for testing the circuitry of flip-flop 300. During scan mode the inverse of the pn4 signal may be output through NAND gate 352 on the scan out (sout) signal line. Sout is disabled (held low) during a functional mode.

The first AOI circuit structure 360 includes transistors to form an AND gate/NOR gate structure. Similarly, the second AOI circuit structure 362 also includes transistors to form an AND gate/NOR gate structure. The second AOI circuit structure 362 does not include any shift circuitry, and accordingly, has fewer transistors when compared to the first AOI circuit structure 360. The flip-flop 300 also includes the NOR gate structure 364. The circuitry illustrated in FIG. 3 may be used to implement the logical elements illustrated in FIG. 1A, which include two AOI circuit structures 118, 120 and a NOR gate 104 (as well as various inverters 102, 116, 114).

As illustrated in FIG. 3, the first AOI circuit structure 360 includes PMOS transistors 302, 304, 306, 308, 310, 324, 326 and NMOS transistors 312, 314, 316, 318, 320, 330. The second AOI circuit structure 362 includes PMOS transistors 336, 338, 340 and NMOS transistors 320, 342, 344. The NOR gate structure 364 includes PMOS transistors 324, 328, 356 and NMOS transistors 332, 334, 358. Additional circuitry in flip-flop 300 includes the inverters 322, 350, 354, and the NAND gate 352.

The first AOI circuit structure 360 includes the function of the AND gate 108, generally formed by the PMOS transistors 308, 324 and the NMOS transistors 312, 320. Additionally, the first AOI circuit structure 360 includes the function of the NOR gate 106. The NOR gate 106 may provide the OR functionality and the inverter functionality. The NOR gate 106 is generally formed by the PMOS transistors 302, 308, 224, and the NMOS transistors 212, 220, 230. The PMOS transistor 302 and the NMOS transistor 330 provide the pn2 signal input to the NOR gate 106. The PMOS transistors 308, 324, and the NMOS transistors 312, 320, which generate the AND function, provide the other input to the NOR gate. (The PMOS transistors 304, 306, 310 and the NMOS transistors 314, 316, 318 provide for scan-input and multiplexer functionality as discussed above.)

Assuming the shift input it low, the flip-flop 300 functions as a d flip-flop with the d input signal as the input to the flip-flop 300. When the shift signal is low, and the nshift signal is high, the PMOS transistor 310 and the NMOS transistor 314 are both off, and no current may flow through the PMOS transistors 306, 310 and the NMOS transistors 314, 318. The PMOS transistor 304 and the NMOS transistor 316 are both on, and current may flow through the PMOS transistors 302, 304, 308 and the NMOS transistors 312, 316, 320, depending on the inputs to the PMOS transistors 302, 308 and the NMOS transistors 320, 312, i.e., the pn2 signal and the d input, respectively. Accordingly, when the shift input is low, the pn1 signal is a function of the d input to the flip-flop, the pn2 signal, and the nclk signal along with some feedback of the pn1 signal (as is also illustrated in the logic diagram illustrated in FIG. 1A).

When the pn1 signal is high, pn1 will continue to be high whenever the nclk signal is low because the PMOS transistors 324, 326 are both on. The PMOS transistor 326 is on because the high pn1 signal is inverted by the inverter 322 coupled to the transistor 326. The PMOS transistor 324 is on because the nclk signal is low.

When the pn2 signal is low, the pn1 signal will be high when the d input is low. The pn1 signal will be high because the PMOS transistors 302, 304, 308 are on when the pn2 signal, the shift signal, and the d input are all low. The NMOS transistor 312 is off because the d input is low. (The PMOS transistor 310 and the NMOS transistor 314 are assumed to be off.) When the pn2 signal is low, the pn1 signal will be low when the d input is high, and the nclk signal is high because the PMOS transistors 302, 304, 308 are off with the pn2 signal high, the shift signal high, and the d input high, respectively. The NMOS transistors 312, 316, 320 are on because the d input is high, the nshift signal is high, and the nclk signal is high, respectively. (Again. the PMOS transistor 310 and the NMOS transistor 314 are assumed to be off.) When the pn2 signal is high, the pn1 signal will be low because the PMOS transistor 302 is off with the signal pn2 high and the NMOS transistor 330 is on with the pn2 signal high.

As illustrated in FIG. 3, when the shift signal is high the shift functionality is active and logical values may be shifted in to the flip-flop using the shift-in (sin) signal. With the shift signal high, the PMOS transistor 304 and the NMOS transistor 316 are off, while the PMOS transistor 310 and the NMOS transistor 314 are on. Accordingly, pn1 is a function of sin, pn2, and nclk. When the pn2 signal is low, the pn1 signal will be high when the sin signal is low because the PMOS transistors 302, 306, 310 are on with the pn2 signal, the sin signal, and the nshift signal low and the NMOS transistor 318 is off because the sin signal is low.

When the pn2 signal is low, the pn1 signal will be low when the sin signal and the nclk signal are high because the PMOS transistors 302, 306, 310 are off with the pn2 signal high, the sin signal high, and the nshift signal high and the NMOS transistors 314, 318, 320 are on because the shift signal, the sin signal, and the nclk signal are all high. When the pn2 signal is high, the pn1 signal will be low because the PMOS transistor 302 is off and the NMOS transistor 330 is on.

The second AOI circuit structure 362 includes PMOS transistors 336, 338, 340 and NMOS transistors 342, 344. The second AOI circuit structure 362 includes an AND gate generally formed by the PMOS transistor 338, 340 and the NMOS transistor 342. The AND gate in the second AOI circuit structure 362 also shares an NMOS transistor 320 with the first AOI circuit structure 360.

Additionally, the second AOI circuit structure 362 includes a NOR gate that may provide the OR functionality and the inverter functionality. The NOR gate is generally formed by the PMOS transistor 336 and the NMOS transistor 344 for the net1/pn2 signal input to the NOR gate and the PMOS transistors 338, 340 and the NMOS transistors 342 which generate the AND function tied to the other input to the NOR gate.

When the pn2 signal is low, the pn4 signal will be high when the nclk signal is low because the PMOS transistors 336, 338 will both be on. When the pn2 signal is low, the pn4 signal will also be high when net2 is low because the PMOS transistors 336, 340 will both be on. With the pn2 signal low, the NMOS transistor 344 will be off. With the net2 signal is low, the NMOS transistor 342 will be off. With the nclk signal is low, the NMOS transistor 320 will be off. Accordingly, pn4 will not be connected to Vcc and Vss at the same time. When the pn2 signal is high, the pn4 signal is low (Vss) because the NMOS transistor 344 is on. (The PMOS transistor 336 is off because pn2 is high.) The pn4 signal may also be pulled low through the NMOS transistors 342, 320, when both net2 and nclk are high. Accordingly, when the clk signal rises, a low value may be clocked into pn4 (corresponding to a high value at the q output and the net2 signal after a delay through the inverters 346, 348 respectively) when net2 starts out as a low value, allowing a high output to be clocked into q output of the flip-flop 300.

The NOR gate structure 364 includes PMOS transistors 324, 326, 328, 356 and NMOS transistors 332, 334, 358. The NOR gate structure 364 may be NOR gate 104 of FIG. 1. The PMOS transistor 356 and NMOS transistor 358, which are each highlighted by a dotted-line oval, provide the flip-flop with an asynchronous set function. When nset is low, the pn2 signal is high independent of the nclk signal. With pn2 high pn4 (in the second AOI circuitry will be low independent of the nclk signal because the NMOS transistor 344 will be on with pn2 high. The q output will be high independent of the nclk signal because it is inverted by the inverter 346.

The NOR gate structure 364 is a two-input CMOS NOR gate including PMOS transistors 324, 328 and NMOS transistos 332, 334. A first input to the NOR gate structure is provided by PMOS transistor 328 and NMOS transistor 332, which are connected to the pn1 signal, as is one of the inputs of the NOR gate 104 of FIG. 1. A second input to the NOR gate structure is provided by PMOS transistor 324 and NMOS transistor 334, which are connected to the nclk signal, as is one of the inputs of the NOR gate 104 of FIG. 1.

Additional circuitry in flip-flop 300 includes inverters 322, 350, 354, and NAND gate 352. The inverter 322 provides an inverted version of pn1 to PMOS transistor 326 that allows the pn1 signal to be pulled high through PMOS transistors 324, 326 as described above. The inverter 350 is used to generate the nshift (not shift) signal used to control the shift features of the flip-flop 300. When the shift signal is high, the pn4 signal may be output on the shift out (sout) signal using NAND gate 352. Additionally, the inverter 354 is used to generate the inverted version of the clk signal, nclk.

Figure 4:
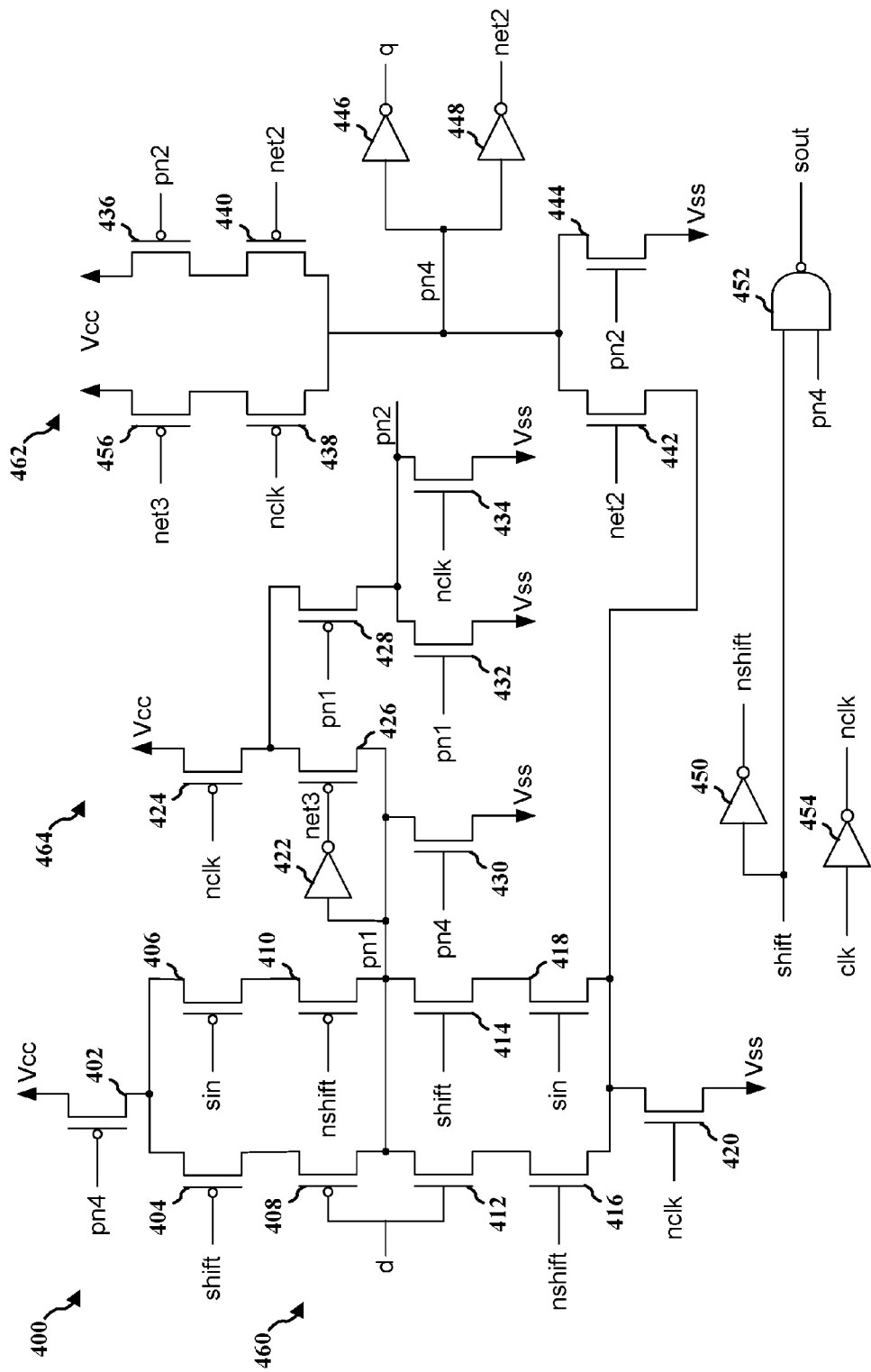
FIG. 4 is another circuit diagram illustrating an example flip-flop in accordance with the systems and methods described herein.

FIG. 4 is another circuit diagram illustrating an example flip-flop 400 in accordance with the systems and methods described herein. The flip-flop 400 is an example of an AOI based flip-flop design using a similar gate structure to the flip-flop 100 of FIG. 1. The flip-flop 400 is generally similar to the flip-flop 200 of FIG. 2 and the flip-flop 300 of FIG. 3 but includes an extra PMOS transistor 456 to help prevent glitches and does not include circuitry providing an asynchronous set function as the flip-flop 300 of FIG. 3 includes. (It will be understood that another example might include features from both FIG. 3 and FIG. 4, i.e., circuitry providing an asynchronous set function and an extra PMOS transistor 456 to help prevent glitches.) The flip-flop 400 includes two AOI circuit structures 460, 462, similar to the two AOI circuit structures 260, 262 of FIG. 2. The dotted line shapes in FIG. 2 used to highlight the AOI circuit structures 260, 262 of FIG. 2 have been omitted from FIG. 4.

The flip-flop 400 includes a scan input for a scan mode and a data input for a functional mode. When the shift signal is low (and the nshift signal is high) the data input is enabled and the scan input is disabled. Conversely, when the shift signal is high (and the nshift signal is low) scan input is enabled and the data input is disabled. The scan mode may be used for testing the circuitry of flip-flop 400. During scan mode the inverse of the pn4 signal may be output through NAND gate 452 on the scan out (sout) signal line. Sout is disabled (held low) during a functional mode.

The first AOI circuit structure 460 includes transistors to form an AND gate/NOR gate structure. Similarly, the second AOI circuit structure 462 also includes transistors to form an AND gate/NOR gate structure. The flip-flop 400 also includes a NOR gate structure 464. The circuitry illustrated in FIG. 4 may be used to implement the logical elements illustrated in FIG. 1A, which include two AOI circuit structures 118, 120 and a NOR gate 104 (as well as various inverters 102, 116, 114).

As illustrated in FIG. 4, the first AOI circuit structure 460 includes PMOS transistors 402, 404, 406, 408, 410, 424, 426 and NMOS transistors 412, 414, 416, 418, 420, 430. The second AOI circuit structure 462 includes PMOS transistors 436, 438, 440 and NMOS transistors 420, 442, 444. The NOR gate structure 464 includes PMOS transistors 424, 428, 456 and NMOS transistors 432, 434, 458. Additional circuitry in flip-flop 400 includes the inverters 422, 450, 454, and the NAND gate 452.

The first AOI circuit structure 460 includes PMOS transistors 402, 404, 406, 408, 410, 424, 426 and NMOS transistors 412, 414, 416, 418, 420, 430. The second AOI circuit structure 462 includes PMOS transistors 436, 438, 440, 456 and NMOS transistors 442, 444. The NOR gate structure 464 includes PMOS transistors 424, 428 and NMOS transistors 432, 434. Additional circuitry in flip-flop 400 includes the inverters 422, 450, 454, and the NAND gate 452.

The first AOI circuit structure 460 includes the function of the AND gate 108, generally formed by the PMOS transistors 408, 424. Additionally, the first AOI circuit structure 460 includes the function of the NOR gate 106. The NOR gate 106 may provide the OR functionality and the inverter functionality. The NOR gate 106 is generally formed by the PMOS transistors 402, 408, 424, and the NMOS transistors 412, 420, 430. The PMOS transistor 402 and the NMOS transistor 430 provide the pn2 signal input to the NOR gate 106. The PMOS transistors 408, 424, and the NMOS transistors 412, 220, which generate the AND function, provide the other input to the NOR gate. As (The PMOS transistors 404, 406, 410 and the NMOS transistors 414, 416, 418 provide for scan-input and multiplexer functionality as discussed above.)

Assuming the shift circuitry input is low, the flip-flop 400 functions as a d flip-flop with the d input signal as the input to the flip-flop 400. When the shift signal is low and the nshift signal is high, the PMOS transistor 410 and the NMOS transistor 414 are both off, and no current may flow through the PMOS transistors 406, 410 and the NMOS transistors 414, 418. The PMOS transistor 404 and the NMOS transistor 416 are both on, and current may flow through the PMOS transistors 402, 404, 408 and the NMOS transistors 412, 416, 420, depending on the inputs to the PMOS transistors 402, 408 and the NMOS transistors 420, 412, i.e., the pn2 signal and the d input, respectively. Accordingly, when the shift circuitry input is low, the pn1 signal is a function of the d input to the flip-flop, the pn2 signal, and the nclk signal along with some feedback of the pn1 signal (as is also illustrated in the logic diagram illustrated in FIG. 1A).

When the pn1 signal is high, pn1 will continue to be high whenever the nclk signal is low because the PMOS transistors 424, 426 are both on. The PMOS transistor 426 is on because the high pn1 signal is inverted by the inverter 422 coupled to the transistor 426. The PMOS transistor 424 is on because the nclk signal is low.

When the pn2 signal is low, the pn1 signal will be high when the d input is low.

The pn1 signal will be high because the PMOS transistors 402, 404, 408 are on when the pn2 signal, the shift signal, and the d input are all low. The NMOS transistor 412 is off because the d input is low. (The PMOS transistor 410 and the NMOS transistor 414 are assumed to be off.) When the pn2 signal is low, the pn1 signal will be low when the d input is high, and the nclk signal is high because the PMOS transistors 402, 404, 408 are off with the pn2 signal high, the shift signal high, and the d input high, respectively. The NMOS transistors 412, 416, 420 are on because the d input is high, the nshift signal is high, and the nclk signal is high, respectively. (Again, the PMOS transistor 410 and the NMOS transistor 414 are assumed to be off.) When the pn2 signal is high, the pn1 signal will be low because the PMOS transistor 402 is off with the signal pn2 high and the NMOS transistor 430 is on with the pn2 signal high.

As illustrated in FIG. 4, when the shift signal is high, the shift functionality is active and logical values may be shifted in to the flip-flop using the shift-in (sin) signal. With the shift signal high, the PMOS transistor 404 and the NMOS transistor 416 are off, while the PMOS transistor 410 and the NMOS transistor 414 are on. Accordingly, pn1 is a function of sin, pn2, and nclk. When the pn2 signal is low, the pn1 signal will be high when the sin signal is low because the PMOS transistors 402, 406, 410 are on with the pn2 signal, the sin signal, and the nshift signal low and the NMOS transistor 418 is off because the sin signal is low.

When the pn2 signal is low, the pn1 signal will be low when the sin signal and the nclk signal are high because the PMOS transistors 402, 406, 410 are off with the pn2 signal high, the sin signal high, and the nshift signal high and the NMOS transistors 414, 418, 420 are on because the shift signal, the sin signal, and the nclk signal are all high. When the pn2 signal is high, the pn1 signal will be low because the PMOS transistor 402 is off and the NMOS transistor 430 is on.

The second AOI circuit structure 462 includes PMOS transistors 436, 438, 440, 456 and NMOS transistors 442, 444. The second AOI circuit structure 462 includes an AND gate generally formed by the PMOS transistor 438, 440, 456 and the NMOS transistor 442. The AND gate in the second AOI circuit structure 462 also shares an NMOS transistor 420 with the first AOI circuit structure 460.

Additionally, the second AOI circuit structure 462 includes a NOR gate that may provide the OR functionality and the inverter functionality. The NOR gate is generally formed by the PMOS transistor 436 and the NMOS transistor 444 for the net1/pn2 signal input to the NOR gate and the PMOS transistors 438, 440, 456 and the NMOS transistors 442 which generate the AND function tied to the other input to the NOR gate. The addition of the PMOS transistor 456 may help eliminate glitches by isolating the pn4 signal from Vcc for the case when the nclk signal is low and the pn2 signal, which may generally be low, is about to transition high. Referring back to FIG. 3, when the nclk signal is low and the pn2 signal is low (and about to transition high), the pn4 signal may be briefly pulled to Vcc through PMOS transistor 336 and the PMOS transistor 338 of FIG. 3. When the pn2 signal transitions high, the pn4 signal will be pulled low through the NMOS transistor 344. In FIG. 4 the PMOS transistor 456 is added. The PMOS transistor 456 is controlled by net3 rather than pn4. Accordingly, the glitch described above, may be avoided.

When the net3 signal is low, the pn4 signal will be high when the nclk signal is low because the PMOS transistor 456 will be on and the PMOS transistor 438 is on. When the pn2 signal is low, the pn4 signal will be high when net2 is low because the PMOS transistor 436 will be on and the PMOS transistor 440 will be on. The PMOS transistor 456 helps eliminate glitches because it holds the pn4 signal high, keeping the q output low when the output q is already low, nclk is low (indicating a time after a rising edge of the clk signal when input values are clocked into the flip-flop 400), when pn1 is high.

With the pn2 signal low, the NMOS transistor 444 will be off. With the net2 signal is low, the NMOS transistor 442 will be off. With the nclk signal is low, the NMOS transistor 420 will be off. Accordingly, pn4 will not be connected to Vcc and Vss at the same time. When the pn2 signal is high, the pn4 signal is low (Vss) because the NMOS transistor 444 is on. (The PMOS transistor 436 is off because pn2 is high.) The pn4 signal may also be pulled low through the NMOS transistors 442, 420, when both net2 and nclk are high. Accordingly, when the clk signal rises, a low value may be clocked into pn4 (corresponding to a high value at the q output and the net2 signal after a delay through the inverters 446, 448 respectively) when net2 starts out as a low value, allowing a high output to be clocked into q output of the flip-flop 400.

The NOR gate structure 464 includes PMOS transistors 424, 426, 428 and NMOS transistors 432, 434. The NOR gate structure 464 may be NOR gate 104 of FIG. 1A. The NOR gate structure 464 is a two-input CMOS NOR gate including PMOS transistors 424, 428 and NMOS transistors 432, 434. A first input to the NOR gate structure is provided by PMOS transistor 428 and NMOS transistor 432, which are connected to the pn1 signal, as is one of the inputs of the NOR gate 104 of FIG. 1A. A second input to the NOR gate structure is provided by PMOS transistor 424 and NMOS transistor 434, which are connected to the nclk signal, as is one of the inputs of the NOR gate 104 of FIG. 1A.

Additional circuitry in flip-flop 400 includes inverters 422, 450, 454, and NAND gate 452. The inverter 422 provides an inverted version of pn1 to PMOS transistor 426 that allows the pn1 signal to be pulled high through PMOS transistors 424, 426 as described above. The inverter 450 is used to generate the nshift (not shift) signal used to control the shift features of the flip-flop 400. When the shift signal is high, the pn4 signal may be output on the shift out (sout) signal using NAND gate 452. Additionally, the inverter 454 is used to generate the inverted version of the clk signal, nclk.

Some examples may include an AOI based flip-flop (100, 200, 300, 400). The flip-flop (100, 200, 300, 400) may include a first AND gate (108, e.g., in the first AOI circuit structures 260, 360, 460). The first AND gate (108, e.g., in the first AOI circuit structures 260, 360, 460) may include a first AND gate first input, a first AND gate second input, and a first AND gate output. The first AND gate first input may be a delay (d) input of the flip-flop (100, 200, 300, 400).

The example may include a first NOR gate (106, in the first AOI circuit structures 260, 360, 460). The first NOR gate (106, in the first AOI circuit structures 260, 360, 460) may include a first NOR gate first input, a first NOR gate second input, and a first NOR gate output. The first AND gate output may be coupled to the first NOR gate first input.

The example may include a second NOR gate (104, in the first AOI circuit structures 260, 360, 460). The second NOR gate (104) may include a second NOR gate first input, a second NOR gate second input, and a second NOR gate output. The first NOR gate output may be coupled to the second NOR gate first input. The second NOR gate output may be coupled to the first NOR gate second input.

The example may include a first inverter (102, 254, 354, 454). The inverter (102, 254, 354, 454) may include a first inverter input and a first inverter output. A clock signal may be coupled to the first inverter input. An inverted clock signal may be output from the first inverter output. The first inverter output may be coupled to the first AND gate second input and the second NOR gate second input.

The example may include a second AND gate (110, e.g., in the second AOI circuit structures 262, 362, 462). The second AND gate may include a second AND gate first input, a second AND gate second input, and a second AND gate output. The second AND gate first input may be coupled to the first inverter output.

The example may include a third NOR gate (112, e.g., in the second AOI circuit structures 262, 362, 462). The third NOR gate (112, e.g., in the second AOI circuit structures 262, 362, 462) may include a third NOR gate first input, a third NOR gate second input, and a third NOR gate output. The third NOR gate first input may be coupled to the second NOR gate output. The third NOR gate second input may be coupled to the second AND gate output.

The example may include a second inverter (114, 116, 246, 248, 346, 348, 446, 448). The second inverter (114, 116, 246, 248, 346, 348, 446, 448) may include a second inverter input and a second inverter output. The second inverter output may be coupled to the second AND gate second input.

In an example, the second inverter output may be a q output of the flip-flop (100, 200, 300, 400), e.g., the inverter may be inverter (114, 246, 346, 446). An example may include a third inverter (114, 246, 346, 446). The third inverter (114, 246, 346, 446) may include a third inverter input and a third inverter output. The third inverter output may be a q output of the flip-flop (100, 200, 300, 400).

In an example, the flip-flop may include a first NAND gate (252, 352, 452). The NAND gate (252, 352, 452) may include a first NAND gate first input, a first NAND gate second input, and a first NAND gate output. The first NAND gate first input may be coupled to a scan input. The first NAND gate second input may be coupled to the second inverter output. The first NAND gate output may be a scan output.

In an example, the flip-flop (300) may include asynchronous set circuitry (PMOS transistor 356, NMOS transistor 358). The asynchronous set circuitry may be configured to set an output of the flip-flop high asynchronously to the clock signal. In an example, the flip-flop (400) may include anti-glitch circuitry (PMOS transistor 456). The anti-glitch circuitry may include a first PMOS transistor (456) coupled to a supply voltage (Vcc) and configured to supply current to a second PMOS transistor (438). The second PMOS transistor (438) forming one of the second AND gate first input or the second AND gate second input. The one of the second AND gate first input or the second AND gate second input coupled to an inverted clock signal (nclck). The first PMOS transistor (456) controlled by a version (net3) of an input (d) to the flip-flop delayed through a pair of inverters (PMOS transistor 408 and NMOS transistor 412, and inverter 422).

Figure 5:
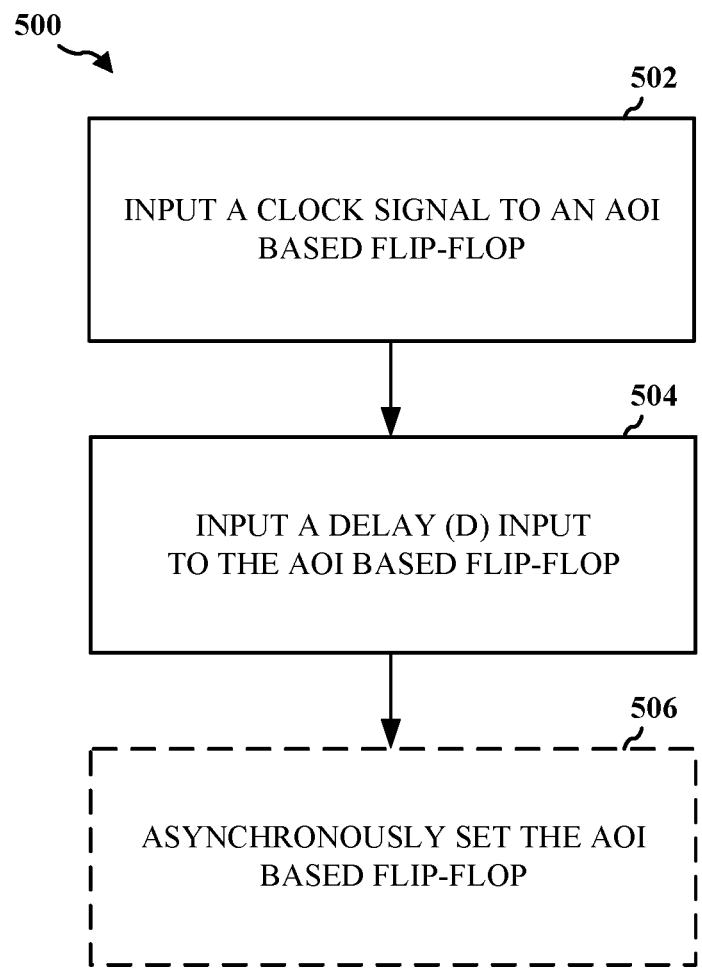
FIG. 5 is a flowchart of a method related to the operation of a flip-flop.

FIG. 5 is a flowchart (500) of a method related to the operation of a flip-flop (100, 200, 300, 400). The method includes a first block (502) to input a clock signal to the AOI based flip-flop. In some examples inputting a clock to the AOI based flip-flop may include using the inverter (102, 254, 354, 454) as well as other circuitry in the flip-flop (100, 200, 300, 400) to input the clock.

As described above, in many circuit designs, devices in the design may use the most power when a state of a signal through a device, e.g., a transistor, changes states. The clock signal may be the most common switching signal in a circuit design. Accordingly, minimizing the devices, e.g., transistors, connected to the clock signal may decrease power used by the circuit. The flip-flops (100, 200, 300, 400) described herein may have fewer components connected to the clock signal.

The method includes a second block (504) to input an input value to the AOI based flip-flop on a delay (d) input. In some examples inputting an input value to the AOI based flip-flop on a delay (d) input may include using an AND gate (108) or circuitry within the first AOI circuit structures (260, 360, 460, such as PMOS transistors 208, 308, 408 and NMOS transistors 212, 312, 412) as well as other circuitry in the flip-flop (100, 200, 300, 400) to input the d input. The method includes an optionally block (506) to asynchronously set the AOI based flip-flop. The AOI based flip-flop may be set asynchronous to the clock signal using, for example, PMOS transistor 356 and NMOS transistor 358 illustrated in FIG. 3.

In some examples a means for inputting a clock signal to the AOI based flip-flop may include the inverter (102, 254, 354, 454) as well as other circuitry in the flip-flop (100, 200, 300, 400). In some examples a means for inputting an input value to the AOI based flip-flop on a delay (d) input may include an AND gate (108) or circuitry within the first AOI circuit structures (260, 360, 460, such as PMOS transistors 208, 308, 408 and NMOS transistors 212, 312, 412) as well as other circuitry in the flip-flop (100, 200, 300, 400). In some examples, a means for asynchronously setting the AOI based flip-flop asynchronous to the clock signal may include PMOS transistor 356, NMOS transistor 358.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:
1. A flip-flop comprising:
   a first AND gate including a first AND gate first input, a first AND gate second input, and a first AND gate output, the first AND gate first input being a delay (d) input of the flip-flop;
   a first NOR gate including a first NOR gate first input, a first NOR gate second input, and a first NOR gate output, the first AND gate output coupled to the first NOR gate first input;
   a second NOR gate including a second NOR gate first input, a second NOR gate second input, and a second NOR gate output, the first NOR gate output coupled to the second NOR gate first input, the second NOR gate output coupled to the first NOR gate second input;
   a first inverter including a first inverter input and a first inverter output, the first inverter input configured to receive a clock signal, the first inverter output configured to output an inverted clock signal, the first inverter output coupled to the first AND gate second input and the second NOR gate second input;
   a second AND gate including a second AND gate first input, a second AND gate second input, and a second AND gate output, the second AND gate first input coupled to the first inverter output;

a third NOR gate including a third NOR gate first input, a third NOR gate second input, and a third NOR gate output, the third NOR gate first input coupled to the second NOR gate output, the third NOR gate second input coupled to the second AND gate output; and a second inverter including a second inverter input and a second inverter output, the second inverter output coupled to the second AND gate second input.

2. The flip-flop of claim 1, the second inverter output being a q output of the flip-flop.

3. The flip-flop of claim 1, further comprising a third inverter including a third inverter input and a third inverter output, the third inverter output being a q output of the flip-flop.

4. The flip-flop of claim 1, further comprising a first NAND gate including a first NAND gate first input, a first NAND gate second input, and a first NAND gate output, the first NAND gate first input coupled to a scan input, the first NAND gate second input coupled to the second inverter output, the first NAND gate output being a scan output.

5. The flip-flop of claim 1, further comprising asynchronous set circuitry, the asynchronous set circuitry configured to set an output of the flip-flop asynchronously to the clock signal.

6. The flip-flop of claim 1, further comprising anti-glitch circuitry.

7. The flip-flop of claim 6, the anti-glitch circuitry including a first PMOS transistor coupled to a supply voltage and configured to supply current to a second PMOS transistor, the second PMOS transistor forming one of the second AND gate first or the second AND gate second input, the one of the second AND gate first or the second AND gate second input coupled to an inverted clock signal, the first PMOS transistor controlled by a version of an input to the flip-flop delayed through a pair of inverters.

8. A method of an AND-OR-Inverter (AOI) based flip-flop operation comprising:
    inputting a clock signal to the AOI based flip-flop; and
    inputting an input value to the AOI based flip-flop on a delay (d) input; the AOI based flip-flop including:
        a first AND gate including a first AND gate first input, a first AND gate second input, and a first AND gate output, the first AND gate first input being the d input of the AOI based flip-flop;
        a first NOR gate including a first NOR gate first input, a first NOR gate second input, and a first NOR gate output, the first AND gate output coupled to the first NOR gate first input;
        a second NOR gate including a second NOR gate first input, a second NOR gate second input, and a second NOR gate output, the first NOR gate output coupled to the second NOR gate first input, the second NOR gate output coupled to the first NOR gate second input;
        a first inverter including a first inverter input and a first inverter output, the clock signal coupled to the first inverter input, an inverted clock signal output from the first inverter output, the first inverter output coupled to the first AND gate second input and the second NOR gate second input;
        a second AND gate including a second AND gate first input, a second AND gate second input, and a second AND gate output, the second AND gate first input coupled to the first inverter output;
        a third NOR gate including a third NOR gate first input, a third NOR gate second input, and a third NOR gate output, the third NOR gate first input coupled to the second NOR gate output, the third NOR gate second input coupled to the second AND gate output; and
        a second inverter including a second inverter input and a second inverter output, the second inverter output coupled to the second AND gate second input.

9. The method of claim 8, wherein the second inverter output being a q output of the AOI based flip-flop.

10. The method of claim 8, wherein the AOI based flip-flop further comprises a third inverter including a third inverter input and a third inverter output, the third inverter output being a q output of the AOI based flip-flop.

11. The method of claim 8, wherein the AOI based flip-flop further comprises a first NAND gate including a first NAND gate first input, a first NAND gate second input, and a first NAND gate output, the first NAND gate first input coupled to a scan input, the first NAND gate second input coupled to the second inverter output, the first NAND gate output being a scan output.

12. The method of claim 8, further comprising asynchronously setting the AOI based flip-flop asynchronous to the clock signal.

13. The method of claim 8, wherein the AOI based flip-flop further comprises anti-glitch circuitry.

14. An AOI based flip-flop comprising:
    means for inputting a clock signal to the AOI based flip-flop; and
    means for inputting an input value to the AOI based flip-flop on a delay (d) input; the AOI based flip-flop including:
        a first AND gate including a first AND gate first input, a first AND gate second input, and a first AND gate output, the first AND gate first input being the d input of the AOI based flip-flop;
        a first NOR gate including a first NOR gate first input, a first NOR gate second input, and a first NOR gate output, the first AND gate output coupled to the first NOR gate first input;
        a second NOR gate including a second NOR gate first input, a second NOR gate second input, and a second NOR gate output, the first NOR gate output coupled to the second NOR gate first input, the second NOR gate output coupled to the first NOR gate second input;
        a first inverter including a first inverter input and a first inverter output, the clock signal coupled to the first inverter input, an inverted clock signal output from the first inverter output, the first inverter output coupled to the first AND gate second input and the second NOR gate second input;
        a second AND gate including a second AND gate first input, a second AND gate second input, and a second AND gate output, the second AND gate first input coupled to the first inverter output;
        a third NOR gate including a third NOR gate first input, a third NOR gate second input, and a third NOR gate output, the third NOR gate first input coupled to the second NOR gate output, the third NOR gate second input coupled to the second AND gate output; and
        a second inverter including a second inverter input and a second inverter output, the second inverter output coupled to the second AND gate second input.

15. The AOI based flip-flop of claim 14, wherein the second inverter output being a q output of the AOI based flip-flop.

16. The AOI based flip-flop of claim 14, wherein the AOI based flip-flop further comprises a third inverter including a third inverter input and a third inverter output, the third inverter output being a q output of the AOI based flip-flop.

17. The AOI based flip-flop of claim 14, wherein the AOI based flip-flop further comprises a first NAND gate including a first NAND gate first input, a first NAND gate second input, and a first NAND gate output, the first NAND gate first input coupled to a scan input, the first NAND gate second input coupled to the second inverter output, the first NAND gate output being a scan output.

18. The AOI based flip-flop of claim 14, further comprising means for asynchronously setting the AOI based flip-flop asynchronous to the clock signal.

19. The AOI based flip-flop of claim 14, wherein the AOI based flip-flop further comprises anti-glitch circuitry.

* * * * *